United States Patent [19]

Posset

[11] 4,380,040
[45] Apr. 12, 1983

[54] CAPACITIVE SYSTEMS FOR TOUCH CONTROL SWITCHING

[75] Inventor: Robert Posset, Mont-sur-Marchienne, Belgium

[73] Assignee: BFG Glassgroup, Paris, France

[21] Appl. No.: 176,029

[22] Filed: Aug. 7, 1980

[30] Foreign Application Priority Data

Sep. 28, 1979 [GB] United Kingdom ............... 7933729

[51] Int. Cl.³ .............................................. H01G 7/00
[52] U.S. Cl. ............................ 361/280; 200/DIG. 1; 361/278
[58] Field of Search ............... 361/278, 280, 330, 288, 361/283; 200/DIG. 1; 340/365 C

[56] References Cited

U.S. PATENT DOCUMENTS

| | | | |
|---|---|---|---|
| 2,496,095 | 1/1950 | Kallmann | 361/330 X |
| 3,710,209 | 1/1973 | Webb | 361/288 |
| 3,974,472 | 8/1976 | Gould | 340/365 C |
| 4,064,550 | 12/1977 | Dias | 361/283 |
| 4,090,092 | 5/1978 | Serrano | 200/DIG. 1 |
| 4,091,610 | 5/1978 | Sasaki | 200/DIG. 1 |
| 4,123,631 | 10/1978 | Lewis | 200/DIG. 1 |

FOREIGN PATENT DOCUMENTS 1464094 2/1977 United Kingdom ......... 200/DIG. 1

*Primary Examiner*—Elliot A. Goldberg
*Attorney, Agent, or Firm*—Spencer & Kaye

[57] ABSTRACT

In capacitive systems comprising a dielectric sheet 11 having a first electrode 12 on one side, and on the other side in capacitive relation with the first electrode 12, second and third electrodes 13, 14 which are mutually spaced by a gap 15 especially for use in touch control switches, it is desired to achieve a favorable compromise between high capacitance modification as between touched and untouched condition of the first electrode 12, and the total amount of material used to form the electrodes.

To this end, the third or outer electrode 14 is shaped to surround at least the major part of the periphery of the second or inner electrode 13, and the ratio of the area of the inner electrode 13 to the area of the outer electrode 14 is greater than 0.25 to 1.

9 Claims, 5 Drawing Figures

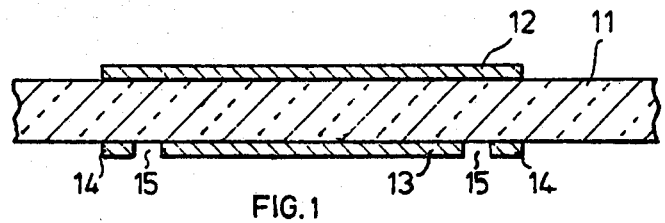
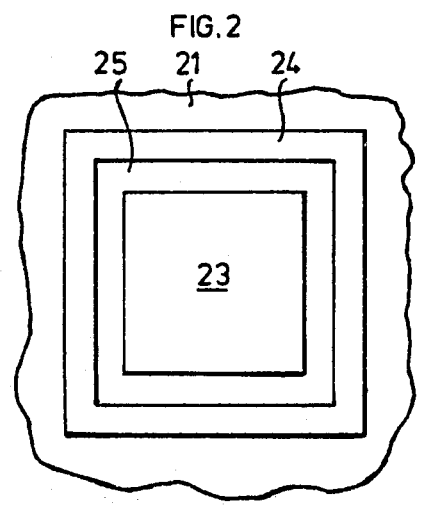
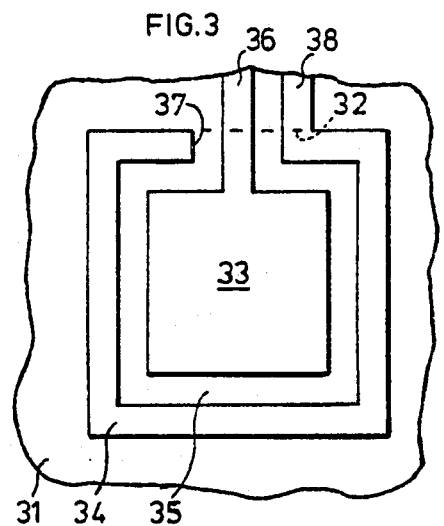
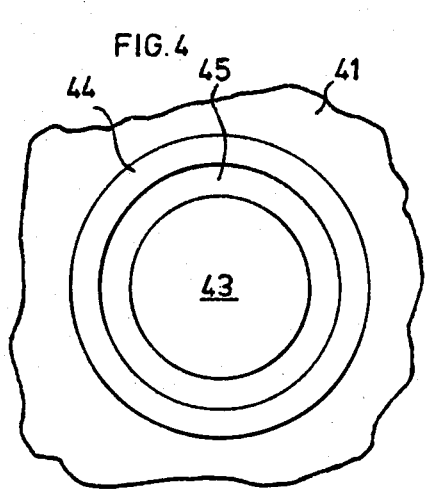
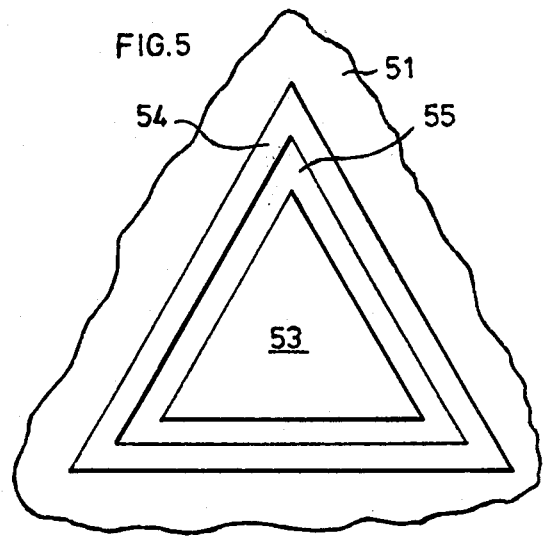

CAPACITIVE SYSTEMS FOR TOUCH CONTROL SWITCHING

BACKGROUND OF THE INVENTION

The present invention relates to a capacitive system comprising a dielectric sheet having a first electrode (touch pad) on one side thereof and on the other side thereof in capacitive relation with the first electrode, second and third electrodes which are mutually spaced.

Such capacitive systems are useful inter alia in touch control switching systems. In such switching systems, an AC signal is applied to the second or third electrode and an output signal circuit is connected to the other of them, so that when the first electrode is touched with a finger, the resulting change in the capacitive coupling between the second and third electrodes via the first gives rise to an output signal which may be used to effect the desired switching. These switching systems may be used in many ways, for example as computer inputs, in telephone "touch dialling" systems, in lift or elevator control systems and in control systems for domestic appliances such as cookers. For reliable operation of the control systems there is a general requirement that the modification of capacitance of the touch control system between the untouched and the touched condition should be as high as possible to facilitate detection of the modification by the detection circuitry. It is also desirable that the capacitance of the system should also be as high as possible. The reason for this is that the signal applied by a pulse generator to the electrode should keep the highest level possible when entering the detection circuitry taking account of the capacity of the input impedance. The higher this level the easier it will be to reject noise signals by means of a threshold circuit incorporated into the detection circuitry. For some commercially available detection circuits which have been especially developed for capacitive touch control switching systems a typical value to be achieved for the capacitance of the system of 3 pF may be cited. Lower capacitances may of course be used, depending on the sensitivity of the control circuitry, but as stated high values are preferred. As is well known, the capacitance (C) of a flat-plate capacitor is given by the formula $C = K \cdot (k\, a/d)$ where a is the total area, d is the thickness of the dielectric, k the dielectric constant and K is a constant depending on the units chosen. Thus for a given dielectric material, in order to increase the capacitance of a capacitor, one can make its plates of larger area or one can decrease the thickness of the dielectric sheet separating the plates.

Capacitive systems with which the present invention is concerned may be considered as two capacitors interconnected in series. One capacitor is formed by the second and first electrodes, and the other by the first and third electrodes. In fact there may be some capacitive interaction between the second and third electrodes, depending on the physical construction of the system, thus forming a third capacitor connected in parallel with the two series connected capacitors. The total capacitance of series interconnected capacitors is given by the reciprocal of the sum of the reciprocals of the capacitances of the individual capacitors, and from this it would seem to follow that for maximum capacitance in a capacitive system of the type with which the invention is concerned, the second and third electrodes should have equal area. Thus a typical system of the known type has a square first electrode on one face of a glass sheet and rectangular second and third electrodes on the other face of the sheet. In a practical example, the first electrode is formed by a tin oxide coating on a glass sheet 4.9 mm thick and is 26 mm square while the second and third electrodes are of a conductive silver-containing enamel deposited in rectangles measuring 26 × 12 mm and spaced apart by 2 mm. Such a system has a total capacitance of 3.8 pF.

The capacitance values where indicated in this application are obtained by measurement with a universal bridge WAYNE KERR, type B224. The measures are effected under normal ambient conditions. The capacitive switching system is disposed horizontally with the $SnO_2$ coating located on top. Standard connecting wires are connected by means of terminal clamps fixed to wires 5 mm in length soldered to the second and third electrodes.

The electrodes of the capacitive switching system are built up from conductive materials applied to the dielectric sheet. Such conductive materials include conductive oxides or enamels as well as metals. The cost of the electrodes depends on the quantity of material used. For mass production of the switching system it is of course of interest to reduce the quantity of materials used. This is particularly true for instance when the electrodes are made starting from a silver containing paste. Any reduction of the quantity of paste used will favourably influence the cost price of the product. It is accordingly desirable to make switches with a small area and/or to reduce their active surface area.

There is another reason for preferring switches of small area, especially where a plurality of such switches are to be disposed in an array as, for example, for telephone dialling systems. In that case, an array of ten switches each occupying an area 26 mm square would take up too much space to be of practical value. It would be desirable to decrease the space taken up by the electrodes to an area approximately corresponding to that which would be occupied by a finger tip touching the switch, for example an area 12 mm square. However, a capacitive system consisting of a 12 mm square first electrode of tin oxide deposited on a surface of a sheet of glass 4.9 mm thick with second and third rectangular electrodes (also of tin oxide) each 12 × 5 mm and spaced apart by 2 mm has a capacitance of 1.4 pF. For the reasons explained before it is desirable to obtain a better level of capacitance for such an arrangement. This can be achieved by reducing the thickness of the dielectric. In the case of a glass sheet, by reducing the thickness to 1 mm, the total capacitance can be increased to 3.1 pF.

The fragility of a sheet of glass 1 mm thick renders it less than ideal for forming a surface which is to be repeatedly tapped.

SUMMARY OF THE INVENTION

It is an object of the present invention to provide an improved capacitive system of the kind referred to, and by which it is possible more easily to achieve a favourable compromise between high capacitance modification between touched and untouched condition and the quantity of material to be used for forming the electrodes which depends upon the dimensions of the system.

According to the present invention, there is provided a capacitive system comprising a dielectric sheet having a first electrode on one side thereof, and on the other side thereof in capacitive relation with the first electrode, second and third electrodes which are mutually spaced, characterised in that of said second and third electrodes, one (hereinafter called "the outer electrode") is shaped to surround at least the major part of the periphery of the other (hereinafter called "the inner electrode") and in that the ratio of the area of the inner electrode to the area of the outer electrode is greater than 0.25 to 1.

It has been found that by arranging the second and third electrodes in this way it is possible for a given dimension of a capacitive system to have the best compromise between capacitance, capacitance modification and quantity of material used for the electrodes. Only by way of an example, it is possible for a given total switch area to increase the capacitance of the system while keeping the same capacitance modification and while keeping or reducing the quantity of material used. Further it is possible while keeping to the same threshold capacitance to decrease the sheet area occupied by the capacitive system, or to increase the sheet thickness. It is to be noted that these advantages may not be apparent, or so apparent, when use is made of very thin glass sheets i.e. sheets 1 mm or less in thickness. In fact it has been found from the results of certain tests made by the applicants that the advantage (in terms of the relative increase in capacitance afforded) is greater when thicker glass e.g. glass 3 to 6 mm in thickness is used as dielectric, as is preferred.

Advantageously, the ratio of the area of the inner electrode to the area of the outer electrode is greater than 0.5 to 1.

Some of the test results referred to are summarised in the following table.

In all cases the first electrode was a tin oxide coating deposited on a glass substrate. The second and third electrodes were made of a layer obtained by baking a silver containing lacquer. In systems I to VIII, the first electrode occupied a square measuring 26×26 mm, and the second and third electrodes were deposited on the opposite face of the glass within a registering area also measuring 26×26 mm. In system I, given in brackets for comparison, the second and third electrodes were each rectangles 26×12 mm spaced apart by a gap 2 mm wide. In each of systems II to VIII the second or inner electrode was a square of the specified dimensions separated by a square annular gap of the specified width from a square annular third or outer electrode of the specified width. Values for the total capacitance of the system (in pF) are given for 4.9 mm thick glass and in some cases for 2.8 mm and 1 mm thick glass. Values are also given for dC representing the capacitance modification between untouched and touched condition of the system. Further there is also given under the heading "active surface" the surface of the second and third electrodes as a percentage of the total area of the system.

In systems IX to XI, the first electrode occupied a square measuring 12×12 mm and the second and third electrodes were deposited on the opposite face of the glass within a registering area also measuring 12×12 mm. In system IX, given in brackets for comparison, the second and third electrodes were each rectangles measuring 12×5 mm separated by a 2 mm gap. In the other cases (X and XI) the second or inner electrode was a square of the specified dimensions separated by a square annular gap of the specified width from a square annular outer or third electrode of the specified width.

In systems XII to XIV and XV to XVII the first electrode occupied a circular area respectively 29.5 and 13.5 mm in diameter. The second and third electrodes were deposited within a registering circular area of the same dimensions. In the systems XII and XV, the second and third electrodes were segments of circles of the specified diameter separated by a diametral gap 2 mm wide. In the other cases the second or inner electrode occupied a circular area of the specified diameter and was separated by an annular gap of the specified width from an annular third or outer electrode of the specified width.

Figures given in brackets in the table apply to capacitive systems outside the scope of the present invention.

Various inferences can be drawn from the figures given in the table.

From a comparison of systems II to VII with system I, it appears for the 4.9 mm glass that in each case concentric electrodes lead to an increase in the total capacitance. This increase is greater when the inner to outer area ratio increases. This result is obtained while the value of dC is fairly constant. At the same time from the column "active surface area" it appears that the quantity of material used for the second and third electrodes is also reduced.

For system VIII which is outside the scope of the invention it appears that the total capacitance has decreased at the same time as has dC.

Similar results apply for 4.9 mm glass for the systems IX to XVII.

With respect to 2.8 mm glass it appears that similar results are achieved concerning increase in total capacitance and reduced consumption of electrode forming material for systems IX to XI and XV to XVII. But a decrease of dC has to be accepted. The same may be deduced from the other systems, if a sufficient high inner/outer area ratio is chosen.

Similar results may be inferred from the tables for 1 mm glass, but here again it is most desirable to select a high inner/outer area ratio, and a reduction of dC has to be accepted.

In the cases where a reduction of capacitance is indicated, the system may still be considered as valuable on the basis that the quantity of electrode forming material used is reduced. This may be of particular interest for capacitance systems of great area which already require large amounts of electrode material.

From a comparison of the capacitances of the systems numbered II and VI with those of system I, of system X with system IX, of systems XIII and XIV with system XII, and of system XVII with system XV, it will be noted that the improvement in capacitance is greater when the dielectric substrate is 4.9 mm thick glass than it is when the dielectric is 2.8 mm thick, and also that in most cases there is in fact a reduction in capacitance when the dielectric is only 1 mm thick.

It will further be noted from systems VIII and XI that a ratio between the areas of the second and third electrodes of less than 0.25 gives worse results even for the thicker glass.

From a comparison of systems II, IV and VI, of systems X and XI, of systems XIII and XIV and of systems XVI and XVII, it will be noted that for a same outer electrode area, a greater total capacitance is given by a greater inner electrode area.

Also from the table, it will be apparent that the sum of the areas of the second and third electrodes should be high for best results, that is, the area of the gap between those electrodes should be relatively small. It should however be borne in mind that reducing that gap area will increase capacitive inter-action between the second and third electrodes.

| System | Second (inner) electrode mm | Third (outer) electrode mm | Gap width mm | Inner electrode area mm² | Outer electrode area mm² | Inner/outer area ratio | Total Capacitance when untouched | | | Capacitance change when touched dC | | | Active surface area % | Total area mm² |
|---|---|---|---|---|---|---|---|---|---|---|---|---|---|---|
| | | | | | | | 1mm glass pF | 2.8mm glass pF | 4.9mm glass pF | 1mm glass pF | 2.8mm glass pF | 4.9mm glass pF | | |
| I | (26 × 12) | (26 × 12) | (2) | (312) | (312) | (1) | (12) | (5.4) | (3.8) | (8.8) | (3.8) | (2.3) | (92.3) | (676) |
| II | 20 × 20 | 2 | 1 | 400 | 192 | 2.08 | 12.1 | 7.5 | 6.6 | 8.2 | 3.7 | 2.2 | 87.6 | 676 |
| III | 20 × 20 | 1 | 2 | 400 | 100 | 4.0 | — | — | 5.1 | — | — | 2.1 | 74.0 | 676 |
| IV | 18 × 18 | 2 | 2 | 324 | 192 | 1.69 | — | — | 5.1 | — | — | 2.3 | 76.3 | 676 |
| V | 16 × 16 | 3 | 2 | 256 | 276 | .93 | — | — | 4.7 | — | — | 2.2 | 78.7 | 676 |
| VI | 16 × 16 | 2 | 3 | 256 | 192 | 1.33 | 9.7 | 5.4 | 4.5 | 7.1 | 3.0 | 2.1 | 66.3 | 676 |
| VII | 14 × 14 | 4 | 2 | 196 | 352 | .56 | — | — | 4.3 | — | — | 2.0 | 81.1 | 676 |
| VIII | (10 × 10) | (6) | (2) | (100) | (480) | (.21) | (—) | (—) | (3.4) | (—) | (—) | (1.5) | (85.8) | (676) |
| IX | (12 × 5) | (12 × 5) | (2) | (60) | (60) | (1) | (3.1) | (1.9) | (1.4) | (2.4) | (1.0) | (0.6) | (83.3) | (144) |
| X | 6 × 6 | 2 | 1 | 36 | 80 | .45 | 3.0 | 2.2 | 2.2 | 2.1 | 0.7 | 0.5 | 80.6 | 144 |
| XI | (4 × 4) | (2) | (2) | (16) | (80) | (.2) | (2.1) | (1.8) | (1.3) | (1.6) | (0.7) | (0.3) | (66.7) | (144) |
| XII | (29.5) | (29.5) | (2) | (312) | (312) | (1) | (12.5) | (5.6) | (4.1) | (8.8) | (3.8) | (2.3) | (91.4) | (683) |
| XIII | 23.5 | 2 | 1 | 434 | 173 | 2.50 | 12.1 | 7.7 | 6.6 | 8.0 | 3.7 | 2.3 | 88.7 | 683 |
| XIV | 19.5 | 2 | 3 | 299 | 173 | 1.72 | 10.1 | 5.5 | 4.4 | 7.3 | 3.5 | 2.3 | 69.0 | 683 |
| XV | (13.5) | (13.5) | (2) | (58) | (58) | (1) | (3.2) | (1.9) | (1.5) | (2.4) | (1.0) | (0.6) | (81.2) | (143) |
| XVI | 7.5 | 2 | 1 | 44 | 72 | .61 | 3.6 | 3.0 | 2.5 | 2.5 | 0.9 | 0.5 | 81.0 | 143 |
| XVII | 5.5 | 2 | 2 | 24 | 72 | .33 | 2.4 | 2.0 | 1.6 | 1.6 | 0.7 | 0.5 | 67.1 | 143 |

It has also been found that for the best results, the areas occupied by the first electrode on the one side of the dielectric and by the second and third electrodes and their intervening gap on the other side should be substantially equal and in register, and accordingly this feature is also preferred.

The electrodes are preferably formed by coatings deposited on the dielectric sheet.

The electrodes may be formed of any suitable conductive material, and it is by no means essential that the electrodes on the different sides of the dielectric sheet should be of the same material. While it is preferable that the first electrode should be of a wear-resistant material, since it is that electrode which would be exposed when the capacitive system is in use as part of a touch control circuit, this is not a requirement for the second and third electrodes. As examples of suitable conductive materials, metals, e.g. copper, conductive oxides e.g. tin oxide, and conductive enamels, e.g. silver enamels may be cited. When a conductive oxide is used, it preferably contains a doping agent.

The preferred dielectric material is glass.

It will of course be appreciated that glass, especially thin glass, is not highly impact resistant. In order to confer an improved resistance to shocks, it is preferred that said dielectric sheet be a tempered glass sheet. In view of the difficulties involved in thermally tempering a thin glass sheet, it is preferred that such sheet should be chemically tempered. As to this preferred feature of the present invention, attention is drawn to my copending patent application Ser. No. 176,030 filed concurrently herewith, entitled: "Capacitive touch control switch panels and method of manufacturing them", which provides: a touch control switch panel comprising a dielectric sheet carrying at least one touch switch, the or each switch comprising a first, touchable electrode on one side of said sheet and second and third mutually separated electrodes on the opposite side of the sheet in capacitive relation to the first electrode, characterised in that said dielectric sheet is of glass which has been subjected to a chemical tempering treatment, and in that at least one said electrode is constituted by a coating deposited on the sheet.

BRIEF DESCRIPTION OF THE DRAWING

Various preferred embodiments of the invention will now be described with reference to the accompanying diagrammatic drawings, in which:

FIG. 1 is a sectional view through an embodiment of capacitive system according to the invention, and FIGS. 2 to 5 are each a plan view showing the second and third electrodes of a capacitive system according to the invention.

DESCRIPTION OF THE PREFERRED EMBODIMENTS

In FIG. 1, a dielectric sheet 11 has deposited on its upper surface a first electrode 12. A second or inner electrode 13 of similar shape to the first electrode but of lesser area is deposited on the lower surface of the sheet. A third or outer electrode 14 is also deposited on the lower surface of the sheet 11 to surround at least the greater part of the periphery of the second electrode 13. The second and third electrodes are separated by a gap 15. The outer boundary of the third electrode 14 is substantially congruent and in register with the boundary of the first electrode 12.

FIG. 2 shows a capacitive system in which a dielectric sheet 21 has deposited on one surface a square second or inner electrode 23 surrounded by a square annular third or outer electrode 24. These two electrodes are separated by a square annular gap 25. A square first electrode (not shown) is deposited on the other surface of the dielectric sheet 21 with its boundary in register with the outer boundary of the outer electrode 24.

In FIG. 3, a square inner or second electrode 33 is deposited on a dielectric sheet 31. A lead-in conductor 36 is provided for the second electrode 33 and leads through a break 37 in an otherwise annular square outer electrode 34. The inner and outer electrodes 33, 34 are separated by a gap 35. The outer electrode 34 is provided with a lead-in conductor 38. The lead-in conductors 36 and 38 are suitably formed of the same material as and are deposited at the same time as the electrodes 33, 34. Part of the boundary of a first electrode deposited on the other face of the dielectric sheet 31 is indicated at 32. In this embodiment, and other embodiments in which lead-in conductors are provided and/or in which the outer electrode is broken, the area of the inner or outer electrode includes any part of a conductor connected thereto which is in register with a part of the first electrode, and the gap between the second and third electrodes is taken to extend to the boundary of the first electrode, that is to say, in the case illustrated in FIG. 3, the area of the gap 35 is taken to include that part of the area of the break 37 in the outer electrode which is not covered by the lead-in conductor 36 for the inner electrode 33. The distance between the lead-in wires 36,38 should be sufficient to avoid the creation of too great a capacitive coupling between them. The break 37 in the outer electrode 34 should also be sufficiently wide that the lead-in wire 36 does not have too great a capacitive coupling with the outer electrode.

FIG. 4 illustrates a capacitive system in which a dielectric sheet 41 has applied thereto a circular inner electrode 43 and an annular outer electrode 44 separated by a gap 45. A registering first electrode (not shown) of the same diameter as the outer diameter of the outer electrode 44 is applied to the other face of the dielectric sheet 41.

FIG. 5 illustrates a capacitive system of triangular form comprising an inner electrode 53 and a generally concentric triangular outer electrode 54 both deposited on a dielectric sheet 51 and separated by a triangular gap 55. The outer periphery of the outer electrode 55 is congruent and in register with a first electrode (not shown) on the opposite face of the dielectric sheet 51.

According to FIGS. 1 to 5, the second and third electrodes are applied to the dielectric sheet. In a modification these electrodes are not deposited upon the dielectric sheet but upon a printed circuit board associated with the capacitive system. Such a printed circuit board with two electrodes is fixed as a whole to the dielectric sheet e.g. by glueing in register with the first electrode.

I claim:

1. A capacitive system for touch control switching comprising a dielectric sheet having a first electrode on one side thereof said first electrode constituting a touch pad, and on the other side thereof in capacitive relation with the first electrode, second and third electrodes which are mutually spaced, characterised in that of said second and third electrodes, one constitutes an inner electrode and the other constitutes an outer electrode and is shaped to surround at least the major part of the periphery of said inner electrode and in that the ratio of the area of said inner electrode to the area of said outer electrode is greater than 0.25 to 1.

2. A capacitive system according to claim 1, characterised in that the ratio of the area of the inner electrode to the area of the outer electrode is greater than 0.5 to 1.

3. A capacitive system according to claims 1 or 2, characterised in that the areas occupied by the first electrode on the one side of the dielectric and by the second and third electrodes and their intervening gap on the other side are substantially equal and in register.

4. A capacitive system according to claim 1, characterised in that the electrodes are formed by conductive coatings deposited on the dielectric sheet.

5. A capacitive system according to claim 4, characterised in that said first electrode is constituted by a conductive tin oxide coating.

6. A capacitive system according to claim 1, characterised in that said dielectric sheet is of glass.

7. A capacitive system according to claim 6, characterised in that said dielectric glass sheet is between 3 mm and 6 mm in thickness.

8. A capacitive system according to claims 6 or 7, characterised in that said glass sheet is tempered.

9. A capacitive system according to claim 1 characterised in that said outer electrode surrounds substantially more than one-half the periphery of said inner electrode.

* * * * *